(12) United States Patent
Marsh

(10) Patent No.: US 8,475,677 B2
(45) Date of Patent: Jul. 2, 2013

(54) ETCHANT GAS

(75) Inventor: Eugene P. Marsh, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/369,490

(22) Filed: Feb. 9, 2012

(65) Prior Publication Data

US 2012/0138850 A1     Jun. 7, 2012

Related U.S. Application Data

(62) Division of application No. 11/732,673, filed on Apr. 4, 2007, now Pat. No. 8,124,541.

(51) Int. Cl.
*C09K 13/08*     (2006.01)

(52) U.S. Cl.
USPC .......................... 252/79.1; 252/79.2; 252/79.3

(58) Field of Classification Search
USPC ....................................... 252/79.1, 79.2, 79.3
See application file for complete search history.

(56) References Cited

U.S. PATENT DOCUMENTS

| | | | |
|---|---|---|---|
| 5,431,774 A | 7/1995 | Douglas | |
| 5,705,443 A | 1/1998 | Stauf et al. | |
| 5,814,238 A | 9/1998 | Ashby et al. | |
| 5,976,394 A | 11/1999 | Chung | |
| 6,846,424 B2 | 1/2005 | Baum et al. | |
| 6,958,295 B1 | 10/2005 | DeOrnellas et al. | |
| 2001/0024679 A1 | 9/2001 | Baum et al. | |
| 2002/0090450 A1 | 7/2002 | Hartner et al. | |
| 2003/0080088 A1 | 5/2003 | Kagami et al. | |
| 2004/0222185 A1 | 11/2004 | Kawai | |

FOREIGN PATENT DOCUMENTS

JP        52131470 A        11/1977

*Primary Examiner* — Shamim Ahmed
(74) *Attorney, Agent, or Firm* — TraskBritt

(57) ABSTRACT

An etchant gas and a method for removing at least a portion of a late transition metal structure. The etchant gas includes $PF_3$ and at least one oxidizing agent, such as at least one of oxygen, ozone, nitrous oxide, nitric oxide and hydrogen peroxide. The etchant gas provides a method of uniformly removing the late transition metal structure or a portion thereof. Moreover, the etchant gas facilitates removing a late transition metal structure with an increased etch rate and at a decreased etch temperature. A method of removing a late transition metal without removing more reactive materials proximate the late transition metal and exposed to the etchant gas is also disclosed.

13 Claims, 1 Drawing Sheet

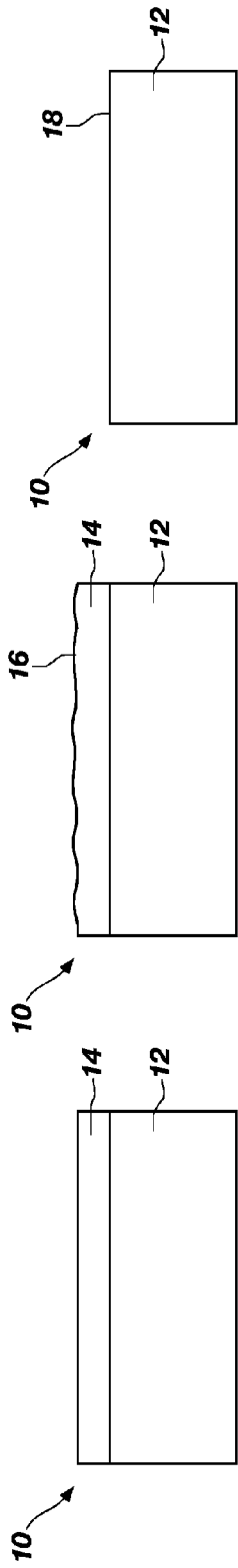
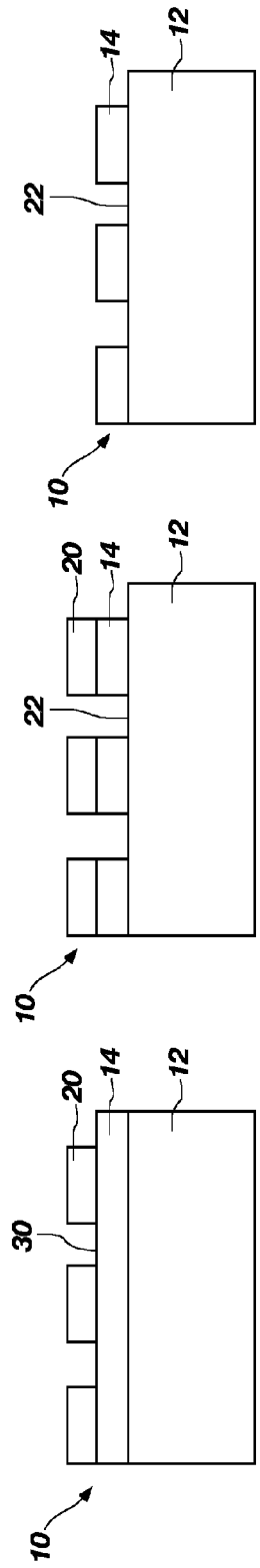
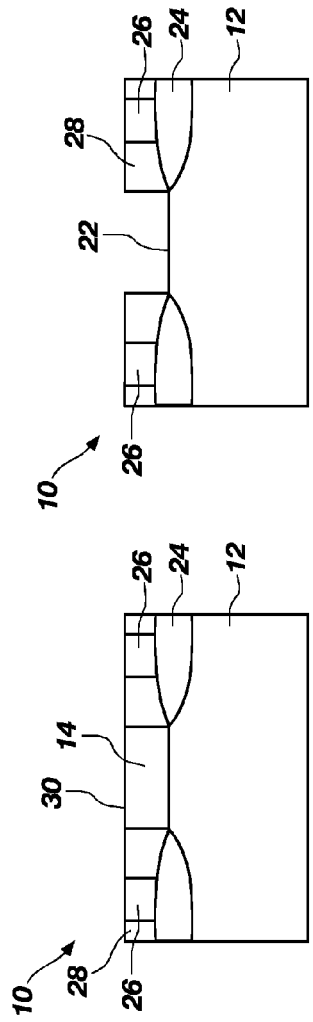

ETCHANT GAS

CROSS-REFERENCE TO RELATED APPLICATION

This application is a divisional of U.S. patent application Ser. No. 11/732,673, filed Apr. 4, 2007, now U.S. Pat. No. 8,124,541, issued Feb. 28, 2012, the disclosure of which is hereby incorporated herein by this reference in its entirety.

FIELD OF THE INVENTION

The invention relates to an etchant gas for removing material from a late transition metal structure, and associated method. More specifically, the invention relates to an etchant gas that includes trifluorophosphine ($PF_3$) and at least one oxidizing agent, and the use thereof.

BACKGROUND

Transition metals are of increasing importance in a variety of electronic and electrochemical applications. This is because transition metals are excellent electrical conductors, are generally unreactive and resist oxidation. In addition, late transition metals form stable interfaces with high dielectric constant (high-k) materials and form good electrical contacts with other metals used for interconnection. Thus, the late transition metals have suitable properties for a variety of uses in the formation of an integrated circuit (IC). They are particularly suitable for use as electrodes in high-k capacitors and ferroelectric capacitors, and in metallization stacks and barriers between dielectric material and silicon substrates in semiconductor devices.

The increasing use of late transition metals in electronic and electrochemical applications requires a reliable manner of etching such metals. However, late transition metals are difficult to uniformly and selectively etch. Late transition metals, such as platinum, rhodium, iridium, palladium, copper, cobalt, iron, nickel, silver, osmium, gold and ruthenium, are conventionally wet etched using aqua regia or ion milling. Halogen-containing gases, such as chlorine gas or hydrogen bromide, and oxygen have also been used to plasma etch platinum. Since the late transition metals are relatively unreactive, highly reactive etchants are typically used. However, if during fabrication, the IC includes other exposed materials, such as main group metals, early transition metals, hardmask materials or photoresist materials, these highly reactive etchants remove the other exposed materials at a faster rate than the late transition metal or damage the other exposed materials. Alternatively, high temperature etching is used to increase the etch rate of the unreactive late transition metal. However, other exposed materials, such as hardmask or photoresist materials, are not typically compatible with high temperature, corrosive etches.

U.S. Pat. No. 6,846,424 discloses a process for plasma etching noble metal-based material structures. The noble metal-based material is etched using a halogenated organic compound and a gas that provides an oxidizing ambient environment. The gas is included to prevent the deposit of polymeric by-products on a surface of an etch chamber.

Since late transition metals are unreactive and difficult to selectively and uniformly etch, improved etchants and methods of removing the late transition metals are desired.

BRIEF DESCRIPTION OF THE SEVERAL VIEWS OF THE DRAWINGS

While the specification concludes with claims particularly pointing out and distinctly claiming that which is regarded as the present invention, the advantages of the embodiments of the invention may be more readily ascertained from the following description of embodiments of the invention when read in conjunction with the accompanying drawings in which:

FIGS. 1A-1C are cross-sectional views of an embodiment of an intermediate semiconductor device structure during various stages of fabrication;

FIGS. 2A-2C are cross-sectional views of another embodiment of an intermediate semiconductor device structure during various stages of fabrication; and FIGS. 3A and 3B are cross-sectional views of an embodiment of an intermediate semiconductor device structure during various stages of fabrication.

DETAILED DESCRIPTION OF THE INVENTION

An etchant gas for at least partially removing a late transition metal structure on a substrate is disclosed. As used herein, the term "late transition metal structure" means and includes a layer or film, a nonplanar mass, such as a three-dimensional mass having a substantially nonplanar configuration, or other structure formed from a late transition metal. The late transition metal may include, but is not limited to, platinum, rhodium, iridium, palladium, copper, cobalt, iron, nickel, ruthenium, silver, osmium, gold, alloys thereof and combinations thereof. As used herein, the term "substrate" refers to a base material or construction upon which the late transition metal structure is formed. The substrate may be a semiconductor substrate, a base semiconductor layer on a supporting structure, a metal electrode or a semiconductor substrate having one or more layers, structures or regions formed thereon.

The etchant gas includes $PF_3$ (trifluorophosphine) and at least one oxidizing agent (i.e., oxidizer or oxidant). The etchant gas may include the $PF_3$ and the oxidizing agent in vaporous form. The etchant gas may comprise, consist essentially of, or consist of the $PF_3$ and the at least one oxidizing agent. Examples of suitable oxidizing agents include, but are not limited to, oxygen ($O_2$), ozone ($O_3$), nitrous oxide ($N_2O$), nitric oxide (NO), hydrogen peroxide ($H_2O_2$) or combinations thereof. In one embodiment, the oxidizing agent is $O_2$. In another embodiment, the oxidizing agent is $O_3$. The oxidizing agent may be selected depending on the presence or absence of additional material layers or other structures that may be exposed to the etchant gas. If the late transition metal structure is the only exposed material, $O_2$, $O_3$ or combinations thereof may be used as the oxidizing agent. However, if other material layers are exposed to the etchant gas, $O_2$ may be used as the oxidizing agent to reduce or prevent damage to the other material layers. The etchant gas may include the $PF_3$ and the oxidizing agent in a ratio of from about 2:1 to about 4000:1, such as in a ratio of from about 2:1 to about 1000:1.

The etchant gas may be used, in accordance with embodiments of the invention, to remove at least a portion of a late transition metal structure. For instance, the etchant gas may be used to remove a desired portion of the late transition metal structure or to remove substantially all of the late transition metal structure. While specific embodiments herein describe using the etchant gas to remove a platinum layer or other structure, the etchant gas may also be used to remove a layer or other structure formed from one or more of the above-mentioned metals. The etchant gas may be used to vapor etch the late transition metal structure.

The etchant gas may be introduced into a chamber that is configured to hold the substrate upon which the late transition metal structure is formed. By way of non-limiting example, the chamber may be a CVD deposition chamber. The chamber may include a chuck for supporting and heating the substrate to a desired temperature and a showerhead for dispensing the etchant gas. For the sake of example only, the chamber may be a deposition furnace, a CVD-type chamber or an ALD-type chamber. The chamber may be configured to provide the $PF_3$ and the oxidizing agent as vapors. For instance, the $PF_3$ and oxidizing agent in vaporous form may be introduced into the chamber.

The etchant gas may be introduced into the chamber at a sufficient flow rate to affect removal of the late transition metal structure. The etchant gas may be continuously flowed or pulsed into the chamber. The flow rate of the $PF_3$ may range from about 1000 standard cubic centimeters per minute (sccm) to about 20000 sccm and the flow rate of the oxidizing agent may range from about 5 sccm to about 500 sccm. In one embodiment, the flow rate of the $PF_3$ gas is about 2000 sccm and the flow rate of the oxidizing agent is about 100 sccm. During the removal of the late transition metal layer, the pressure within the chamber may be maintained at from about 10 mtorr to about atmospheric pressure (about 760 torr), such as at about 200 torr. The substrate may be maintained at a temperature within a range of from about 320° C. to about 600° C., such as at a temperature within a range of from about 320° C. to about 450° C. The temperature of the substrate may be substantially identical to a temperature at which the chuck is maintained. While the $PF_3$ may begin to decompose at a temperature greater than about 450° C., the etchant gas may, nonetheless, be used at higher temperatures by balancing the rate of etching the late transition metal structure with the decomposition of the $PF_3$.

In one embodiment, a platinum structure may be substantially removed from the substrate by exposing the platinum structure to the etchant gas that includes $PF_3$ and $O_2$. The flow rate of the $PF_3$ may be about 2000 sccm and the flow rate of the $O_2$ may be about 100 sccm. The chuck temperature may be maintained at about 400° C. and the chamber may be maintained at a pressure of about 200 torr.

The late transition metal structure may be subjected to the etchant gas for an amount of time sufficient to remove a desired portion of the late transition metal structure. If only a portion of the late transition metal structure is to be removed, the late transition metal structure may be exposed to the etchant gas for a relatively short amount of time. Conversely, if substantially all of the late transition metal structure is to be removed, the late transition metal structure may be exposed to the etchant gas for a longer amount of time. For the sake of example only, the exposure time may range from about 30 seconds to about 30 minutes. By varying the exposure time, the etchant gas may be used as a bulk etch of the late transition metal or may be used to remove the desired portion of the late transition metal structure. The late transition metal structure may be removed at a removal rate of about 100 Å/minute.

If $PF_3$ is used (without the oxidizing agent) to etch platinum at a temperature above about 450° C., the $PF_3$ removes about 400 Å of platinum in about 30 seconds. However, the removal process is relatively non-uniform because portions of the platinum etch rapidly, while other portions of the platinum etch slowly. In addition, a phosphorous residue forms on the platinum as a result of thermal decomposition of the $PF_3$. At a temperature above 450° C., the $PF_3$ thermally decomposes to form hydrogen fluoride, oxides of phosphorous and halogenated compounds, which are believed to produce the phosphorous residue. While not wishing to be bound by any specific theory, it is believed that the phosphorous residue forms an etch-inhibiting layer on the surface of the late transition metal structure, causing decreased etch uniformity.

The inclusion of the oxidizing agent in the etchant gas may reduce or eliminate the phosphorous residue that forms on the late transitional metal structure. While not wishing to be bound by any specific theory, it is believed that the oxidizing agent facilitates etching the late transitional metal structure by reacting with the phosphorous residue. Volatile oxides of phosphorus or volatile compounds of the late transition metal are produced by the oxidation reaction and may be easily removed or discharged from the chamber. The removal of the late transition metal structure using $PF_3$ and the oxidizing agent is believed to be a reverse chemical vapor deposition (CVD) process. For the sake of example only, if a platinum layer is etched with the $PF_3$ and the oxidizing agent, tetrakis-trifluorophosphine ($Pt(PF_3)_4$) is believed to form, which is volatile and may be removed from the chamber. By reducing or eliminating the formation of the phosphorus residue, the etchant gas may increase etch uniformity of the late transition metal structure and may provide an increased etch rate. During the oxidation of the phosphorus residue, the $PF_3$ remains available to etch the late transition metal structure and does not form free fluorine. In other words, the $PF_3$ functions as the etchant but does not provide a fluorine source.

The ability to etch the late transition metal structure with the etchant gas at a temperature below about 450° C. also decreases or prevents thermal decomposition of the $PF_3$. Because $PF_3$ is not decomposed, phosphorous oxides are not released. While not wishing to be bound by any particular theory, this may reduce or eliminate formation of the phosphorous residue on the surface of the late transition metal structure. Preventing the decomposition of the $PF_3$ also facilitates uniform etching by maintaining a constant amount of the $PF_3$ available for etching.

Since the vapor etch is conducted at a lower temperature, the etchant gas may also enable the late transition metal structure to be selectively removed without removing or otherwise damaging other exposed material layers, such as photoresist, amorphous carbon, or metal materials. Since photoresist or amorphous carbon materials are damaged at high temperatures, the late transition metal structure may be selectively removed from an intermediate semiconductor device structure that includes the late transition metal structure and at least one of these materials without removing or otherwise damaging the other material.

The etchant gas may be used in the fabrication of intermediate semiconductor device structures that include at least one late transition metal structure. The late transition metal structure may be formed on the substrate by conventional techniques, which are not described in detail herein. The late transition metal structure may be an electrode of a high-k capacitor or may be a metal stack. Only those process acts and structures necessary to understand the embodiments of the present invention are described in detail herein. Additional acts to form semiconductor device structures may be performed by conventional fabrication techniques, which are not described in detail herein.

For the sake of example only, the methods are described below in reference to fabricating an electrode or metal stack on the intermediate semiconductor device structure, which is subsequently processed by conventional techniques to produce the semiconductor device structure. The semiconductor device structure may include, but is not limited to, a FLASH device, a DRAM device, a logic device, or other device. The semiconductor device structure may be used in wireless devices, personal computers, or other electronic devices, without limitation. However, the methods may also be used in other situations where a late transition metal structure is to be selectively and/or uniformly removed.

FIGS. 1A-1C illustrate removing at least a portion of a late transition metal structure 14 present on an intermediate semiconductor device structure 10 by etching an exposed surface of the intermediate semiconductor device structure 10 with the etchant gas that includes the $PF_3$ and oxidizing agent. FIG. 1A illustrates the intermediate semiconductor device structure 10 that includes a substrate 12 and the late transition metal structure 14 disposed over the substrate 12. As illustrated in FIG. 1B, a portion of the late transition metal structure 14 may be uniformly removed by exposure to the etchant gas to form, for example, an electrode or a barrier layer on the intermediate semiconductor device structure 10. The etchant gas may be used to uniformly remove the portion of the late transition metal structure 14, without substantially forming a phosphorous residue on a surface 16 of the late transition metal structure 14. To remove at least a portion, or substantially all, of the late transition metal structure 14, the intermediate semiconductor device structure 10 may be placed in the chamber and the etchant gas introduced into the chamber for the desired exposure time, as previously described. The thickness of the late transition metal layer 14 remaining on the substrate 12 may depend upon the ultimate use of the intermediate semiconductor device structure 10 that includes the late transition metal electrode. FIG. 1C illustrates the intermediate semiconductor device structure 10 having substantially all of the late transition layer 14 removed from a surface 18 of the substrate 12.

FIGS. 2A-2C illustrate removing at least a portion of the late transition metal structure 14 without substantially removing a mask layer 20. The mask layer 20 may be a hardmask layer or a photoresist layer. FIG. 2A shows the intermediate semiconductor device structure 10 that includes the substrate 12, the late transition metal structure 14 and the mask layer 20 deposited over the late transition metal structure 14. The mask layer 20 may be deposited and patterned by conventional techniques, which are not described in detail herein. If the mask layer 20 is a hardmask layer, the mask layer 20 may be formed from a dielectric material, such as an oxide, or from a carbon-containing material, such as amorphous carbon. If the mask layer 20 is a photoresist layer, the mask layer 20 may be formed from a conventional photoresist material. A surface 30 of the late transition metal structure 14 may be exposed through the mask layer 20.

Since the materials used to form hardmask layers and photoresist layers may decompose at higher temperatures, such materials may not withstand conventional etching conditions. For instance, if subjected to a temperature of greater than or equal to about 335° C., amorphous carbon begins to thermally decompose. Therefore, removal of the exposed portions of the late transition structure 14 from the intermediate semiconductor device structure 10 illustrated in FIG. 2A using a conventional etch process would result in damage or decomposition of the mask layer 20. Thus, in a conventional etch process, additional masking and etching acts are used to protect the mask layer 20. However, the inclusion of the oxidizing agent with the $PF_3$ in the etchant gas to vapor etch the exposed portions of the late transition metal structure 14 enables the etching to be carried out at a temperature as low as about 320° C. As such, the exposed portions of the late transition metal structure 14 may be removed by the etchant gas at a temperature below that at which damage to the mask layer 20 occurs. Thus, the present method provides for removal of the exposed portions of the late transition metal structure 14 without damaging the mask layer 20 during exposure to the etchant gas, eliminating masking and etching acts and reducing the expense of semiconductor fabrication. As shown in FIG. 2B, the mask layer 20 remains substantially intact during the removal of the exposed portions of the late transition metal structure 14 due to the lower temperature etch. Surface portions 22 of the substrate 12 may be exposed by the removal of the late transition metal structure 14. As shown in FIG. 2C, the patterned portions of the mask layer 20 may be removed, exposing the underlying portions of the late transition metal structure 14.

The etchant gas may also be used to selectively remove the late transition metal structure 14 from an intermediate semiconductor device structure 10 that includes the late transition metal structure 14 and a second metal structure 26 having an exposed surface. FIGS. 3A and 3B illustrate removing at least a portion of the late transition metal structure 14 without substantially removing at least a portion of the second metal structure 26. FIG. 3A shows the intermediate semiconductor device structure 10 that includes substrate 12, a field oxide layer 24, the late transition metal structure 14, a second metal structure 26 and dielectric layer 28. The second metal structure 26 may be formed from a metal including, but not limited to, titanium, titanium nitride, tantalum, tantalum nitride or tungsten. For the sake of example only, the late transition metal structure 14 and the second metal structure 26 may be an exposed bottom electrode and an exposed tungsten-filled wordline, respectively. The etchant gas may be used to remove at least a portion of the late transition metal structure 14 without substantially removing at least a portion of the second metal structure 26.

FIG. 3B illustrates the intermediate semiconductor device structure 10 after exposure of the late transition metal structure 14 and the second metal structure 26 to the etchant gas. The late transition metal structure 14 may be substantially removed by exposing a surface 30 of the late transition metal structure 14 to the etchant gas while the second metal structure 26 remains substantially intact. Surface portions 22 of the substrate 12 may be exposed by the removal of the late transition metal structure 14. Thus, the late transition metal structure 14 may be selectively removed without removing or otherwise damaging the second metal structure 26. As such, time-consuming and expensive acts, such as masking and photolithography acts, may be eliminated from the fabrication of semiconductor devices.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. An etchant gas consisting of trifluorophosphine and at least one oxidizing agent.

2. The etchant gas of claim 1, wherein the at least one oxidizing agent is selected from the group consisting of oxygen, ozone, nitrous oxide, nitric oxide, and a peroxide.

3. The etchant gas of claim 1, wherein the at least one oxidizing agent consists of oxygen.

4. The etchant gas of claim 1, wherein the at least one oxidizing agent consists of ozone.

5. The etchant gas of claim 1, wherein a ratio of trifluorophosphine to the at least one oxidizing agent ranges from about 2:1 to about 4000:1.

6. The etchant gas of claim 1, wherein the at least one oxidizing agent consists of oxygen and ozone.

7. The etchant gas of claim 1, wherein the trifluorophosphine and the at least one oxidizing agent are in vaporous form.

8. The etchant gas of claim 1, wherein the at least one oxidizing agent is selected from the group consisting of oxygen, ozone, nitrous oxide, nitric oxide, and hydrogen peroxide.

9. An etchant gas consisting of:
trifluorophosphine; and
at least one oxidizing agent selected from the group consisting of oxygen, ozone, nitrous oxide, nitric oxide, and peroxide.

10. The etchant gas of claim 9, wherein the etchant gas consists of trifluorophosphine and oxygen.

11. The etchant gas of claim 9, wherein the etchant gas consists of trifluorophosphine and ozone.

12. The etchant gas of claim 9, wherein the etchant gas consists of trifluorophosphine, oxygen, and ozone.

13. The etchant gas of claim 1, wherein a ratio of trifluorophosphine to the at least one oxidizing agent ranges from about 2:1 to about 1000:1.

\* \* \* \* \*